United States Patent
Dray et al.

(10) Patent No.: US 7,139,212 B2
(45) Date of Patent: Nov. 21, 2006

(54) MEMORY ARCHITECTURE WITH SEGMENTED WRITING LINES

(75) Inventors: Cyrille Dray, Eybens (FR); Sébastien Barasinski, Meylan (FR); Jean Lasseuguette, Grenoble (FR); Christophe Frey, Austin, TX (US); Richard Fournel, Lumbin (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 11/152,033

(22) Filed: Jun. 14, 2005

(65) Prior Publication Data

US 2005/0281090 A1    Dec. 22, 2005

(30) Foreign Application Priority Data

Jun. 16, 2004   (FR) ................................ 04 06532

(51) Int. Cl.
*G11C 8/00* (2006.01)
(52) U.S. Cl. .................................. 365/230.03; 365/63
(58) Field of Classification Search ........... 365/230.03, 365/63, 171
See application file for complete search history.

(56) References Cited

U.S. PATENT DOCUMENTS

| | | | |
|---|---|---|---|
| 5,029,141 A * | 7/1991 | Yoshimoto et al. .... | 365/230.03 |
| 5,274,597 A * | 12/1993 | Ohbayashi et al. ......... | 365/204 |
| 5,287,304 A | 2/1994 | Harward et al. | |
| 5,748,545 A | 5/1998 | Lee et al. | |
| 6,331,943 B1 | 12/2001 | Naji et al. | |
| 6,335,890 B1 | 1/2002 | Reohr et al. | |
| 6,532,163 B1 | 3/2003 | Okazawa | |
| 6,594,191 B1 | 7/2003 | Lammers et al. | |

(Continued)

FOREIGN PATENT DOCUMENTS

EP    1 320 104    6/2003

OTHER PUBLICATIONS

Preliminary French Search Report, FR 0406532, dated Apr. 21, 2005.

(Continued)

*Primary Examiner*—Vu A. Le
(74) *Attorney, Agent, or Firm*—Jenkens & Gilchrist, P.C.

(57) ABSTRACT

A memory device includes at least one segmented writing line formed by at least one writing segment. A programming circuit is controlled by a line address circuit in a writing mode of the memory device to program at least one memory cell coupled to the segmented writing line. A reading bit line is connected to a reading circuit for reading the contents of the cell in a reading mode of the memory device. The reading bit line cooperates in writing mode with the line address circuit to control the programming circuit of the segmented writing line.

26 Claims, 3 Drawing Sheets

U.S. PATENT DOCUMENTS

| | | |
|---|---|---|
| 6,639,834 B1 | 10/2003 | Sunaga et al. |
| 6,717,844 B1 | 4/2004 | Ohtani |
| 6,778,429 B1 | 8/2004 | Lu et al. |
| 6,778,434 B1 | 8/2004 | Tsuji |
| 6,795,335 B1 | 9/2004 | Hidaka |
| 6,829,162 B1 | 12/2004 | Hosotani |
| 6,862,235 B1 | 3/2005 | Sakata et al. |
| 6,891,742 B1 | 5/2005 | Takano et al. |
| 6,894,918 B1 | 5/2005 | Sharma et al. |
| 6,940,749 B1 | 9/2005 | Tsang |
| 2002/0027803 A1 | 3/2002 | Matsui |
| 2002/0064067 A1 | 5/2002 | Inui |
| 2002/0080644 A1 | 6/2002 | Ito |
| 2003/0026125 A1 | 2/2003 | Hidaka |
| 2003/0058686 A1 | 3/2003 | Ooishi et al. |
| 2004/0052105 A1 | 3/2004 | Fulkerson et al. |
| 2004/0047204 A1 | 6/2004 | Hung et al. |
| 2004/0125643 A1 | 7/2004 | Kang et al. |
| 2004/0208052 A1 | 10/2004 | Hidaka |
| 2005/0180203 A1 | 8/2005 | Lin et al. |
| 2005/0281080 A1 | 12/2005 | Dray et al. |

OTHER PUBLICATIONS

Nahas, "A 4Mb 0.µm 1T1MTJ Toggle MRAM Memory," 2004 IEEE International Solid-State Circuits Conference, ISSCC 2004, Session 2, Non-Volatile Memory/2.3, 0-7803-8267-6, 2004.

Patent Abstracts of Japan, vol. 2000, No. 03, and JP 11 354728, Canon, Inc.

* cited by examiner

MEMORY ARCHITECTURE WITH SEGMENTED WRITING LINES

PRIORITY CLAIM

The present application claims priority from French Application for Patent No. 04 06532 filed Jun. 16, 2004, the disclosure of which is hereby incorporated by reference.

BACKGROUND OF THE INVENTION

1. Technical Field of the Invention

The present invention generally relates to the field of integrated circuit memories and, more particularly, integrated circuit memories having an architecture with segmented writing lines. The invention is typically, but not exclusively, applied to random access magnetic memories of the MRAM type having such an architecture.

2. Description of Related Art

The following description of the invention refers to a MRAM type memory; some reminders of its operation are given below.

MRAM (Magnetic Random Access Memories) are memories of the non-volatile type, where each memory cell is formed by a magnetic tunnel junction. This type of memory has all the combined advantages of present existing semiconductor memories: speed both of writing and of reading, low consumption, non-volatility, and insensitivity to radiations. These advantages are moreover combined with an increased possibility of integration due to the small size of the cells.

A magnetic random access memory typically comprises a matrix of memory cells disposed in rows and columns, across which are passed metallic tracks dedicated to writing and reading. The metallic writing tracks extending along the rows of memory cells are termed writing word lines, and the metallic tracks extending along the columns of cells are termed writing bit lines. Each memory cell so placed at the intersection of a word line and a bit line stores one bit of information in the form of magnetic orientation.

In the standard architecture, the addressing of memory cells for writing then takes place using magnetic fields induced by a matrix network of metallic lines subjected to current pulses; only the memory cell at the intersection of the two selected writing lines having to turn over. For reading, a low amplitude current is sent via a reading bit line and a CMOS control transistor, for example, to read the resistance of the junction. It is to be noted that in this type of memory the reading circuitry is at least partially dissociated from the writing circuitry.

Each of the memory cells is in fact constituted by two magnetic layers, separated by an electrical layer. Each magnetic layer has its own magnetic orientation. The magnetic orientation of one of the layers, termed free layer, may be modified, while the magnetic orientation of the other layer, termed fixed layer, is fixed in a particular orientation. The magnetic orientations of the two layers may occur in two situations: either parallel, that is, aligned in the same direction, or antiparallel, that is, aligned in opposite directions. These two directions, parallel and antiparallel, represent the logic values 1 and 0 respectively. As an alternative, the parallel state may be interpreted as logic 0 and the antiparallel state as logic 1.

Writing therefore consists, for such a memory cell, of positioning the magnetic orientation in the free layer as a function of the desired logic state, in a state either parallel or antiparallel with respect to the magnetic orientation of the fixed layer.

External magnetic fields are typically applied to a selected cell to turn over the magnetic orientation in the free layer of this cell from one state to another. To do this, a writing current is applied respectively to the word line and the bit line intersecting at the location of the selected memory cell. The writing currents applied in this way to the selected word line and bit line create magnetic fields which, when they are combined at the intersection of the word line and the bit line, create magnetic fields which enable the magnetic orientation of the free layer of the selected memory cell to be switched from the parallel to the antiparallel state, or vice versa, as a function of the datum which is to be written in the cell.

The switching from one state to another of a selected memory cell while writing requires high magnetic fields for which sufficiently high currents have to be circulated, of the order of tens of milliamps, at the level of the magnetic tracks constituting the word and writing bit lines at whose intersection the selected memory cell for writing is located.

Moreover, the conductive tracks constituting the writing lines are resistive in nature. The fact or passing a high current of the order of tens of milliamps over a writing line will therefore inevitably cause a fall of potential at its terminals, by Ohm's law. A relatively high supply voltage is therefore necessary at the level of the writing control circuits, to compensate for the fall of potential through metallic writing lines.

However, future memory topologies, particularly responding to increasing constraints of integration, will prevent the use of high voltage transistors for writing current control circuits. In this perspective, convergence to a single nominal supply voltage, for example 1.2 volts, is therefore more and more sought after.

In this context, a MRAM memory architecture may be envisaged with segmented writing word and/or bit lines. In fact, in such an architecture, such as for example described in the patent document U.S. Pat. No. 6,594,191 (the disclosure of which is hereby incorporated by reference), the plural memory cells are disposed in segments along the memory plane. The writing bit and/or word lines crossing the memory plane are then themselves segmented, creating shorter writing current paths. This architecture then implies an equivalent resistive load of the weakest writing lines, thus allowing a lower nominal supply voltage because the line losses are smaller. Such a segmented writing line architecture also enables minimizing the probability of erroneous turnover of non-selected memory cells when writing. In fact, only the memory cells on the path of the selected line segment when writing will then be subjected to the magnetic field generated by passing the writing current through the segment, instead of the whole row and/or column of memory cells.

However, the installation of such an architecture with segmented writing word and/or bit lines implies a certain number of constraints, mainly bearing on the addressing of the different writing line segments.

To illustrate this statement, reference is made to FIG. 1, describing in a simplified manner a portion of an MRAM type memory plane according to a matrix architecture of segmented writing bit lines. A memory plane of the type considered then comprises plural segmented writing bit lines organized in a matrix according to a column architecture, typically 64, 128 or 256 lines, at whose intersection are located the MRAM type memory cells. To simplify the explanation, only two columns and two rows of memory cells have been shown.

Therefore only two writing bit line segments 10 and 20, extending along two columns of the memory plane, are shown with their associated writing circuitry. Two memory cells 30 and 40 are disposed at the intersection of a writing word line 50 and each of the writing bit line segments 10 and 20. An architecture furthermore comprising segmented writing word lines could also be envisaged. The writing circuitry associated with the writing bit line segments to be described could similarly be found at the level of the word line segments.

First of all, the writing bit line segments 10 and 20 are connected at one end to a supply 60, for example 1.2 volts. For writing addressing of one column among a plurality, column address decoding means are provided. These means are constituted by an address bus 70, carrying for example six column address signals in the case of a memory plane comprising 64 columns, associated with address decoding circuits 80 for each column, realized in static logic. The output of each column decoding circuit 80 is provide for piloting programming means 90 associated with the addressed writing bit line segment. These programming means 90, also ensuring the switching of the line segment to earth, are symbolically represented by a transistor of which the source is connected to an earth (ground) line 100, the drain is connected to the writing line segment 10 and the gate is controlled by the output of the column decoding circuit 80.

As for the reading circuitry, it is partially dissociated from the writing circuitry, and will be considered in more detail later in the description.

At this stage, it is suitable first of all to note that plural writing bit line segments (not shown) such as the segment 10, are cascaded along each column of the memory plane. For each cascaded segment of writing bit line, it is necessary to provide programming means, and associated address decoding means therefore have to be provided.

The major of disadvantage of such an architecture with segmented writing lines therefore resides in the necessary redundancy of the address decoding means at each occurrence of a writing line segment, so as to be able to select one writing segment among the plural segments.

In the perspective of a segmented architecture, and taking account of design requirements for increased density of the memories, reproducing the specific address decoding logic cannot be hoped for at the level of all the writing line segments, these elements in fact consuming much space on the memory plane.

There is accordingly a need to remedy the abovementioned disadvantages. It is proposed that a memory device include segmented writing lines in which addressing different writing line segments for writing does not lead to an overload of line address decoding means, and which does not penalize in terms of memory plane density.

SUMMARY OF THE INVENTION

More precisely, the invention concerns, in a first aspect, a memory device comprising at least one segmented writing line, provided with programming means controlled by line addressing means in the writing mode of the memory device, for programming at least one memory cell coupled to the segmented writing line, a reading bit line being connected to a reading circuit for reading the contents of the cell in the reading mode of the memory device. In the context of the present invention, a segmented writing line is understood to be a writing line formed by at least one writing segment.

For this purpose, the invention concerns a memory device comprising at least one segmented writing line formed from at least one writing segment, furnished with programming means, the programming means being controlled by line address means in the writing mode of the memory device, for programming at least one memory cell coupled to the segmented writing line, a reading bit line being connected to a reading circuit for reading the contents of the cell in reading mode of the memory device, wherein the reading bit line cooperates in writing mode with the line addressing means for controlling the means for programming the segmented reading line.

According to a characteristic of the invention, the segmented writing lines comprise writing bit lines.

According to a preferred embodiment, the memory device is organized as a matrix of writing bit lines and writing word lines, the memory cells being positioned at the intersection of the writing lines.

In an alternative, the writing word lines are also segmented.

The reading circuit advantageously comprises column selection means, and means for circulating column selection information in writing mode on the reading bit line to the destination of the addressing means of the programming means associated with the segmented writing line.

According to an embodiment, the means for addressing the programming means associated with the segmented writing line comprise a selection line carrying segment selection information and a logical combination means, a first input of which is connected to the segment selection line, a second input is connected to the reading bit line, and the output of which is provided for activating the programming means associated with the segmented writing line.

According to a particular embodiment, the reading bit line comprises a global reading bit line connected to at least one intermediate reading bit line via intermediate reading bit line selection means, the intermediate reading bit line accessing the memory cell for reading via an access transistor of the cell.

Preferably the global reading bit line is common to two columns of the memory device, the global reading bit line being connected to two intermediate reading bit lines for reading access respectively to each of the two columns.

The memory cells are preferably of the MRAM type.

The invention furthermore concerns an integrated circuit comprising a memory device such as has been described.

In accordance with another embodiment of the invention, a memory device comprises a plurality of memory cells matrix arranged in rows and columns, with a writing line being provided for at least a portion of a column of memory cells. A write drive circuit is operable to drive the writing line so as to cause data of a certain state to be written into at least one of the memory cells of the column portion in a write mode. A reading bit line is coupled to the memory cells of the column portion and further coupled to the write drive circuit. A selection circuit is coupled to the reading bit line for reading data from a selected one of the memory cells of the column portion in a read mode, and for actuating the write drive circuit through the reading bit line in the write mode.

In accordance with another embodiment, a magnetic random access memory comprises a plurality of rows and columns of magnetic random access memory elements, the memory elements along at least a portion of a column having a write bit line and a read bit line. A drive circuit is included for the portion of a column having a drive path coupled in series with the write bit line and a control terminal responsive to a signal on the read bit line.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
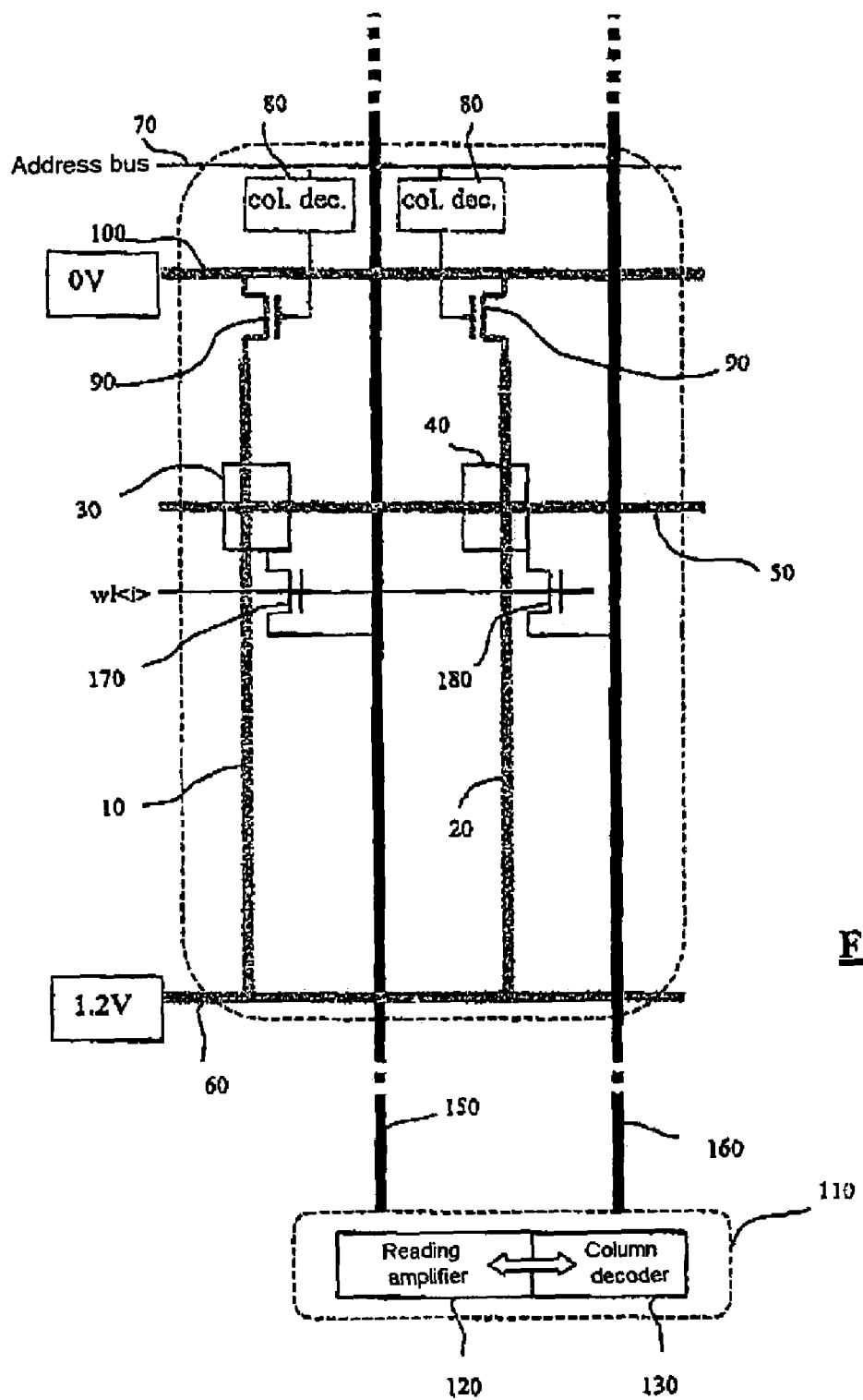
FIG. 1, already described, shows a portion of a MRAM type memory plane according to a matrix architecture with segmented writing bit line, illustrating the problem which the present invention proposes to solve.

Returning to FIG. 1, in order now to examine more precisely the reading means for memory cells of the memory plane: according to the embodiment of FIG. 1, for each column of the memory plane, an associated reading bit line, respectively 150 and 160, is provided, constituted by a metallic track intended to carry a reading current. Each reading bit line has the property of passing through the whole memory plane. A reading word line carrying a w1<i> signal is used to select a row of memory cells for reading, particularly comprising the cells 30 and 40 shown, via reading access transistors, respectively 170 and 180. The simultaneous use of the bit line 150, for example, enables a reading current to be passed through the selected memory cell 30 via the reading access transistor 170 made active by a high state signal applied on the word selection line w1<i>.

To do this, each reading bit line 150, 160 is connected at one end to a reading circuit 110 formed by a reading amplifier 120 associated with column decoding means 130 enabling a column to be selected for reading among plural columns.

It results from the preceding that the material resources implemented in reading mode are in large part dissociated from the material resources implemented in the writing mode of the memory. Moreover, the reading means come up against the same problem as the writing means, concerning the decoding of a column of the memory plane among plural columns. The present invention therefore aims at taking advantage from the fact that the reading means already incorporate column decoding means 130 at the level of the reading circuit 110, enabling a column to be selected for reading among plural columns.

Therefore, in a context of an architecture with segmented writing lines, and more particularly segmented bit lines, the concept of the invention consists of reusing the material resources already present within the memory plane and normally reserved for reading so as to avoid redundancy of the address decoding means of cells selected for writing at the level of each occurrence of a writing bit line segment. It should be noted that the concept of the present invention would equally well be applied to an architecture where the writing lines would be formed by a single writing segment, returning to the consideration of non-segmented lines.

Figure 2:
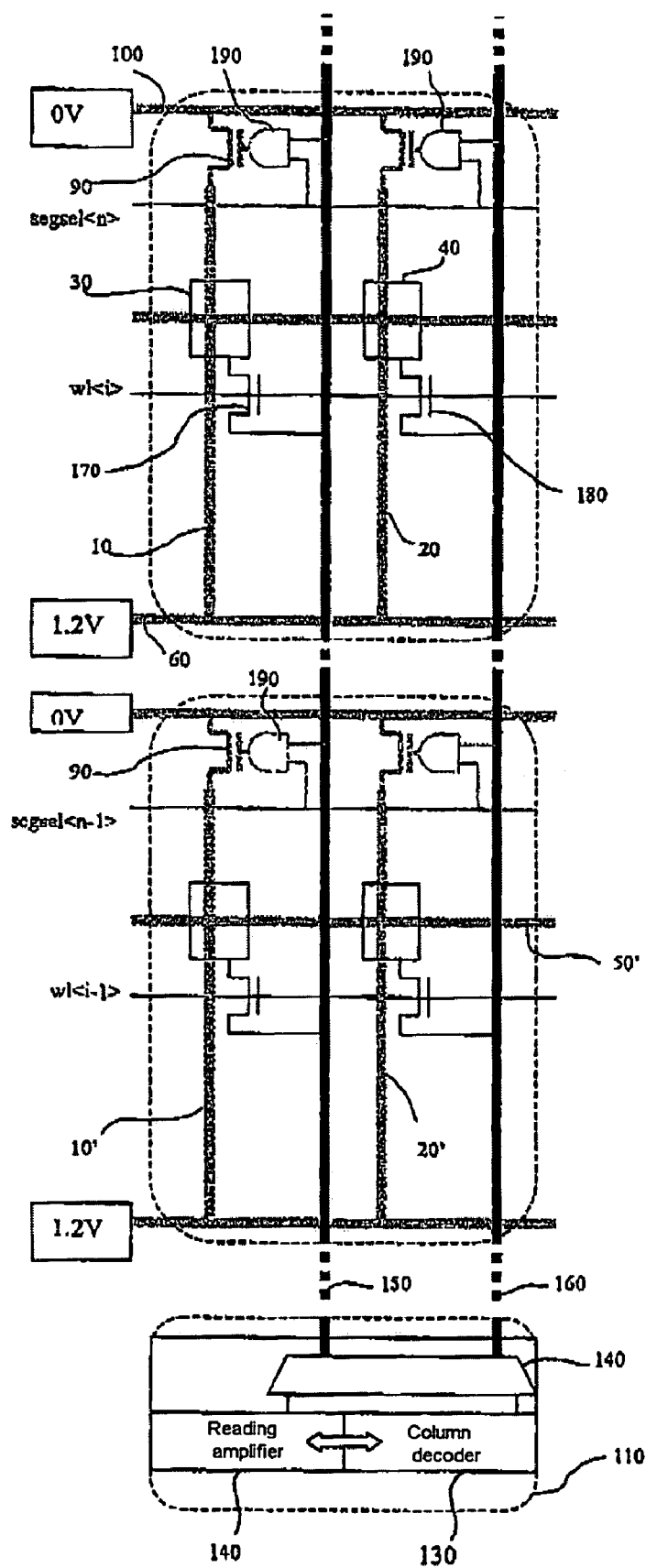
FIG. 2 is a diagram illustrating an embodiment of the memory device according to the present invention.

FIG. 2 shows in this regard an embodiment of the memory device according to the present invention. The elements in common with FIG. 1 retain the same references. In FIG. 2, two columns and two rows of memory cells have been shown this time, each belonging to a different writing segment.

In this way, two supplementary writing bit line segments 10' and 20', extending along the two memory plane columns shown, are cascaded with their associated writing programming means 90. Two memory cells are therefore disposed at the intersection respectively of a writing word line 50' with each of the cascaded writing bit lines 10' and 20'.

According to the invention, the column selection means 130 of the reading circuit 110 will be utilized, providing a column address decoding signal normally reserved for the selection for reading of one column among several columns, as well as the metallic resource of the reading bit lines for enabling the programming means associated with a reading line segment to be addressed for reading. So the column decoding means of the reading circuit are reused for writing, and the reading bit line itself is used for conveying the column selection information to a destination of the writing circuitry.

Taking an example in which it is desired to address for writing the programming means 90 associated with the segmented writing bit line 10, for programming the cell 30. A suitable address signal generated by the column selection means 130 is then sent on the reading bit line 150 corresponding to the column which it is desired to select for writing, via means 140 provided for this purpose within the reading circuit 110 and to which means the set of reading bit lines are connected. These means 140, symbolically shown as a multiplexer in FIG. 2, enable either selecting the reading bit line in reading mode, or conveying the column selection information on the reading bit line.

The column selection information thus carried by the reading bit line 150 then enables the selection of the set of reading bit line segments 10, 10' associated with the column considered.

The memory device according to the invention furthermore comprises a segment selection line for each segment of the device. The segment selection line carrying a signal segsel<n> for the segment considered then passes through the memory plane along the horizontal axis and is provided for conveying supplementary segment selection information. If it is desired to address, also for writing, the programming means 90 of the writing line segment 10', it is then suitable to furthermore activate the segment selection line segsel<n−1>.

The so conveyed supplementary selection information, in combination with the column selection information conveyed by the reading bit line 150, then allows addressing for writing the programming means 90 of the writing line segment 10.

To do this, a logic gate 190, typically an AND type logic gate, belonging to each segment of the writing bit line, comprises a first input connected to the segment selection line segsel<n>, a second input connected to the reading bit line 150, and an output connected to the programming means 90 associated with the segmented reading bit line 10 addressed for writing. The combination of signals by the logic gate 190 then activates the programming means 90 of the desired writing line segment.

The addressing means of the segmented writing bit lines for writing implemented in the memory device according to the present invention are of interest particularly in that only a single logic gate 190 is needed in place of the plural logic gates implicated by the column decoding circuits referenced 80 in FIG. 1. Furthermore, a single horizontal signal per segment, segsel<n>, is made necessary for realizing addressing for writing.

Figure 3:
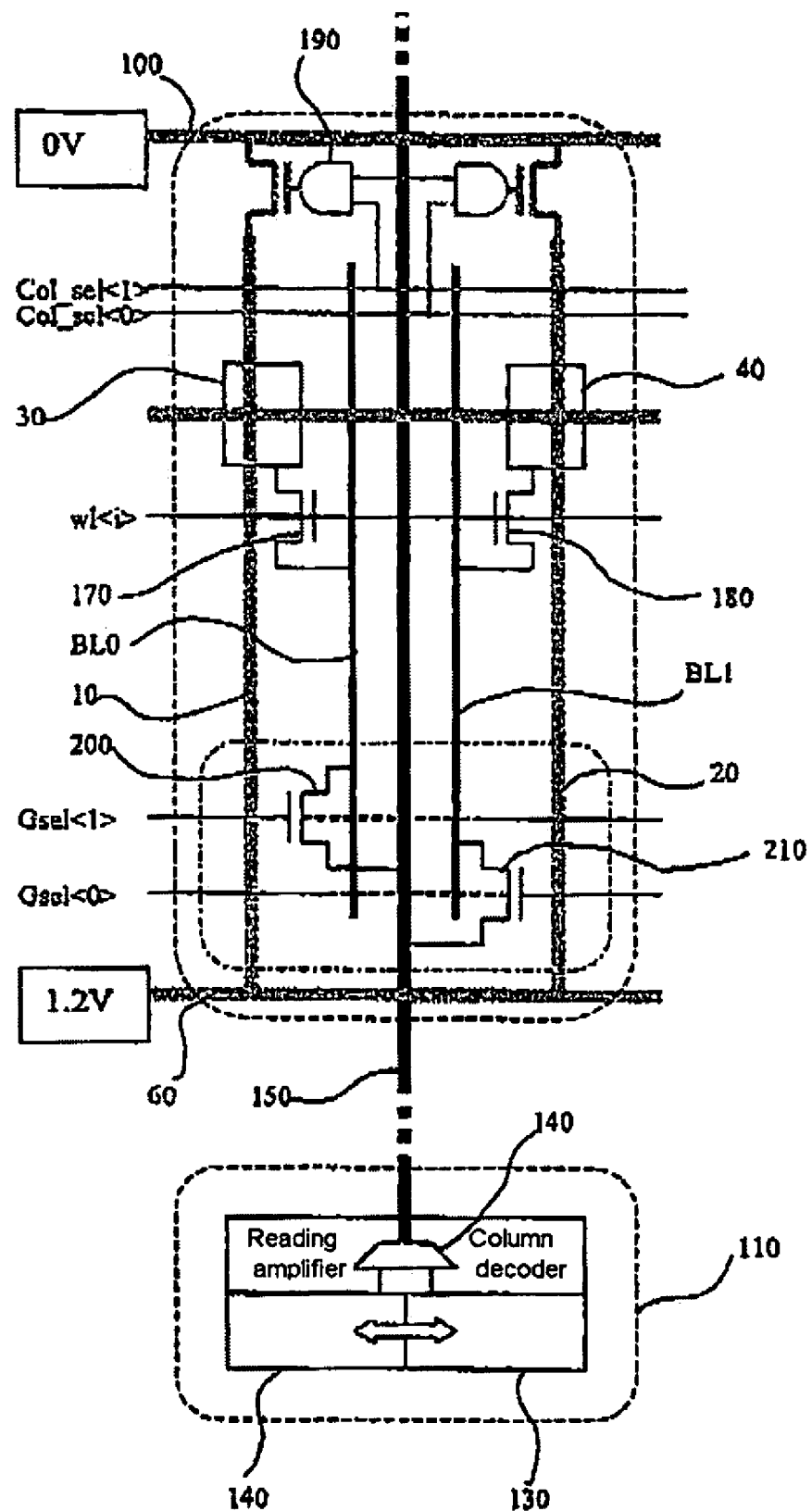
FIG. 3 is an alternative of the memory device according to the present invention, in which circuitry is implemented for reading with global and intermediate bit lines.

FIG. 3 describes, finally, a particular embodiment of the memory device according to the present invention, in which the reading circuitry is modified, more particularly as regards the reading access paths to the memory cells. In this way, according to this embodiment, the reading bit line 150 is a global reading bit line, passing through the whole memory plane, and connected to intermediate reading bit lines. According to an embodiment, a global reading bit line is for example common to two columns of the memory plane and is then provided for being connected to two intermediate reading bit lines BL0, BL1 for reading access to each column respectively. The connection between the global reading bit line and the intermediate reading bit lines is realized via group selection transistors 200, 210 controlled by the Gsel signals. The intermediate bit line BL0 in this way enables reading access to the memory cell 30 via the access transistor 170, and the intermediate bit line BL1 enables reading access to the memory cell 40 via the access transistor 180.

This architecture is of interest in that the set of memory points of a column is no longer directly connected to the global reading bit line, enabling the capacitive charges to be minimized on the global reading bit line and so improvement of performance in terms of speed.

In this way, to read the contents of the cell 30 for example, the global reading line 150 is first selected, then the selection transistor 200 is activated, allowing access to the intermediate bit line BL0 by means of the signal Gsel<1> and then access to the cell 30 is selected by activating the access transistor 170 via the w1<i> signal. During this reading operation, access to the intermediate reading bit line is closed, a Gsel<0> signal being applied to the gate of the corresponding selection transistor 210.

As regards write addressing of the programming means of a writing bit line segment, the column decoding information is conveyed by the global reading bit line 150 to the destination of the writing circuitry. However, during such a use of reading resources in writing mode, it is necessary that the access paths to the intermediate bit lines on the one hand, then to the cells on the other hand, are closed.

In the example, there is a global bit line common to two columns. The column selection information carried by the global reading bit line 150 then enables selection of the set of writing bit line segments for writing, particularly 10 and 20, respectively associated with one of the two columns. In this configuration, for the segment considered, the logic gate 190 associated with each segmented writing bit line 10, 20 then sees one of its inputs connected to the global reading bit line 150. To be able to address for writing one or other segmented line, the other input of each logic gate 190 associated with each segmented writing bit line 10, 20 should then be connected over a different horizontal selection line, respectively Col_sel<1> and Col_sel<0>, so as to select one column among the two addresses.

The concept of the present invention has been more particularly described with reference to a MRAM type memory, but it could be applied in a non-limiting manner to all types of integrated circuit memory having a segmented writing line architecture formed by at least one writing segment and comprising dissociated writing and reading paths.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A memory device comprising:
at least one segmented writing line formed by at least one writing segment and furnished with programming means controlled by line addressing means in a writing mode of the memory device for programming at least one memory cell coupled to the segmented writing line,
a reading bit line being connected to a reading circuit for reading the contents of the cell in reading mode of the memory device,
wherein the reading bit line cooperates in writing mode with the line addressing means to control the programming means of the segmented writing line.

2. The device according to claim 1, wherein the segmented writing lines comprise writing bit lines.

3. The memory device according to claim 1, wherein the memory device is ordered as a matrix in writing bit lines and writing word lines, the memory cells being located at the intersection of the writing lines.

4. The memory device according to claim 3, wherein the writing word lines are segmented.

5. The memory device according to claim 1, wherein the reading circuit comprises column selection means and means for circulating the column selection information in writing mode on the reading bit line to a destination of the addressing means of the programming means associated with the segmented writing line.

6. The memory device according to claim 1, wherein the line addressing means of the programming means associated with the segmented writing line comprises a selection line carrying segment selection information and a logical combination means having a first input connected to the segment selection line, a second input connected to the reading bit line, and an output provided for activating the programming means associated with the segmented writing line.

7. The memory device according to claim 1, wherein the reading bit line comprises a global reading bit line connected to at least one intermediate reading bit line via selection means for intermediate reading bit lines, the intermediate reading bit line accessing the memory cell for reading via an access transistor of the cell.

8. The memory device according to claim 1,
wherein the memory device is ordered as a matrix in writing bit lines and writing word lines, the memory cells being located at the intersection of the writing lines;
wherein the reading bit line comprises a global reading bit line connected to at least one intermediate reading bit line via selection means for intermediate reading bit lines, the intermediate reading bit line accessing the memory cell for reading via an access transistor of the cell; and
wherein the global reading bit line is common to two columns of the memory device, the global writing bit line being connected to two intermediate reading bit lines for access for reading to each of the two columns respectively.

9. The memory device according to claim 1, wherein the memory cells are of the MRAM type.

10. The memory device according to claim 1, wherein the memory device is implemented as an integrated circuit.

11. A memory device, comprising:
a plurality of memory cells matrix arranged in rows and columns;
a writing line provided for at least a portion of a column of memory cells;
a write drive circuit operable to drive the writing line so as to cause data of a certain state to be written into at least one of the memory cells of the column portion in a write mode;
a reading bit line coupled to the memory cells of the column portion and further coupled to the write drive circuit; and
a selection circuit coupled to the reading bit line for reading data from a selected one of the memory cells of the column portion in a read mode, and for actuating the write drive circuit through the reading bit line in the write mode.

12. The memory of claim 11 wherein the memory cells comprise MRAM cells and the writing line comprises a writing bit line for the at least a portion of the column of memory cells.

13. The memory device of claim 12 wherein the MRAM cells further include writing word lines, a combination actuation of the writing bit line and writing word line causing data of the certain state to be written into the memory cell.

14. The memory device of claim 11 wherein the writing line and reading bit line each extend along the memory cells of an entire column of the memory matrix.

15. The memory device of claim 11, further comprising a column selection circuit for providing column selection information, the column selection information being passed in write mode over the reading bit line to the write drive circuit associated with an addressed writing line.

16. The memory device of claim 11 wherein the write drive circuit comprises a current driver to drive current through the writing line and a logical combination circuit whose output actuates the current driver and which receives at its inputs, and logically combines, a signal from the reading bit line and a selection signal.

17. The memory device of claim 11 wherein the writing line extends along the memory cells of an entire column of the memory matrix.

18. The memory device of claim 11 wherein the reading bit line extends along the memory cells of an entire column of the memory matrix.

19. A magnetic random access memory, comprising:
a plurality of rows and columns of magnetic random access memory elements, the memory elements along at least a portion of a column having a write bit line and a read bit line; and
a drive circuit for the portion of a column having a drive path coupled in series with the write bit line and a control terminal responsive to a signal received from the read bit line.

20. The memory of claim 19 further comprising a logic circuit whose output is coupled to the control terminal of the drive circuit and which receives at its inputs, and logically combines, the signal from the reading bit line and a selection signal to cause data of a certain state to be written into at least one of the memory cells of the column portion in a write mode.

21. The memory of claim 20 wherein the memory elements further include a write word line, a combination actuation of the write bit line and write word line causing data of the certain state to be written into the memory cell.

22. The memory of claim 19, further comprising a column selection circuit for providing column selection information, the column selection information being passed in write mode over the read bit line to the gate of the selection transistor associated with an addressed write bit line.

23. The memory of claim 19 wherein the write bit line extends along the memory elements of an entire column of a memory matrix.

24. The memory of claim 19 wherein the read bit line extends along the memory elements of an entire column of a memory matrix.

25. The memory of claim 19 wherein the drive circuit comprises a selection transistor having a source-drain path coupled in series with the write bit line and a gate as the control terminal.

26. The memory of claim 25 further comprising a logical combination circuit whose output is coupled to the gate of the selection transistor and which receives at its inputs, and logically combines, the column selection signal from the reading bit line and a column portion selection signal to cause data of a certain state to be written into at least one of the memory cells of the column portion in a write mode.

* * * * *